US009824735B1

(12) United States Patent
Kan et al.

(10) Patent No.: US 9,824,735 B1
(45) Date of Patent: Nov. 21, 2017

(54) SYSTEM AND METHOD TO GENERATE A RANDOM NUMBER

(71) Applicant: QUALCOMM Incorporated, San Diego, CA (US)

(72) Inventors: Jimmy Jianan Kan, San Diego, CA (US); Chando Park, Irvine, CA (US); Peiyuan Wang, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/237,078

(22) Filed: Aug. 15, 2016

(51) Int. Cl.
*G11C 11/00* (2006.01)
*G11C 11/16* (2006.01)
*G06F 7/58* (2006.01)

(52) U.S. Cl.
CPC ............ *G11C 11/161* (2013.01); *G06F 7/588* (2013.01); *G11C 11/1697* (2013.01)

(58) Field of Classification Search
CPC . G11C 11/16; G11C 11/15; G11C 2211/5614; G11C 11/161; G11C 11/1697; G01F 7/588
USPC ........................................ 365/158, 171, 173
See application file for complete search history.

(56) References Cited

U.S. PATENT DOCUMENTS

| 8,374,021 B2 | 2/2013 | Kanai et al. |
| 9,110,746 B2 | 8/2015 | Zhu et al. |
| 2010/0174766 A1 | 7/2010 | Weeks et al. |
| 2012/0230091 A1* | 9/2012 | Yanagi .................... B82Y 25/00 365/158 |
| 2014/0067890 A1* | 3/2014 | Zhu .......................... G06F 7/582 708/250 |
| 2014/0108478 A1 | 4/2014 | Lee et al. |
| 2017/0178705 A1* | 6/2017 | Buhrman .............. G11C 11/161 |

OTHER PUBLICATIONS

Chun et al., "High-Density Physical Random Number Generator Using Spin Signals in Multidomain Ferromagnetic Layer," Hindawi Publishing Corporation, Advances in Condensed Matter Physics, vol. 2015, Article ID 251819, Received Nov. 23, 2014; Accepted Jan. 21, 2015, 9 pages.
Bishnoi et al., "Architectural Aspects in Design and Analysis of SOT-based Memories," Karlsruhe Institute of Technology, 2014 19th Asia and South Pacific Design Automation Conference (ASP-DAC), Jan. 20-23, 2014, pp. 700-707, IEEE, Piscataway, NJ.
Makarov et al., "SOT-MRAM based on 1Transistor-1MTJ-Cell Structure," 2015 15th Non-Volatile Memory Technology Symposium (NVMTS), Institute for Microelectronics, TU Wien, GuBhausstraBe 27-29/E360, A-1040 Wien, Austria, 4 pages.

(Continued)

*Primary Examiner* — Huan Hoang
(74) *Attorney, Agent, or Firm* — Toler Law Group, PC.

(57) ABSTRACT

An apparatus includes a perpendicular magnetic tunnel junction (MTJ) including a free layer. The apparatus includes a spin orbit torque metal layer coupled to the perpendicular MTJ and configured to change a magnetization state of the free layer responsive to flow of a current along the spin orbit torque metal layer. The apparatus includes a random number generator configured to generate a random number at least partially based on a state of the perpendicular MTJ.

24 Claims, 7 Drawing Sheets

(56) References Cited

OTHER PUBLICATIONS

Garello, K., et al., "Ultrafast magnetization switching by spin-orbit torques," Applied Physics Letters 105, 212402, Nov. 24, 2014, AIP Publishing LLC, Melville, New York, 5 pages.
Liu, L., et al., "Spin-Torque Switching with the Giant Spin Hall Effect of Tantalum," Science, 336 (6081), May 4, 2012, American Association for the Advancement of Science, Washington, D.C., pp. 555-558.
Marukame, T., et al., "Extracting Physically Unclonable Function From Spin Transfer Switching Characteristics in Magnetic Tunnel Junctions," IEEE Transaction on Magnetics, Nov. 2014, vol. 50, No. 11, IEEE, Piscataway, NJ, 4 pages.

* cited by examiner

US 9,824,735 B1

SYSTEM AND METHOD TO GENERATE A RANDOM NUMBER

I. FIELD

The present disclosure is generally related to random number generators.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

The devices may employ data encryption techniques to encrypt data. The encrypted data may be encrypted using an encryption key. The encryption key may be generated using a random number generator (RNG). RNGs (pseudo-RNGs) may be based on software or oscillator clock jitter. These RNGs are inefficient, susceptible to external attacks, use high power, or do not generate random numbers based on a random physical process.

III. SUMMARY

In a particular aspect, an apparatus includes a perpendicular magnetic tunnel junction (MTJ) including a free layer. The apparatus includes a spin orbit torque metal layer coupled to the perpendicular MTJ and configured to change a magnetization state of the free layer responsive to flow of a current along the spin orbit torque metal layer. The apparatus includes a random number generator configured to generate a random number at least partially based on a state of the perpendicular MTJ.

In another particular aspect, a method includes changing a magnetization state of a free layer of a perpendicular magnetic tunnel junction (MTJ) responsive to flow of a current along a spin orbit torque metal layer that is coupled to the perpendicular MTJ. The method further includes generating a random number based at least in part on a state of the perpendicular MTJ.

In another particular aspect, an apparatus includes a first perpendicular magnetic tunnel junction (MTJ) including a first free layer. The apparatus further includes a second perpendicular MTJ including a second free layer. The apparatus further includes a word line. The apparatus further includes a spin orbit torque metal layer coupled to the first free layer, to the second free layer, and to the word line. The spin orbit torque metal layer is configured to change a magnetization state of the first free layer and the second free layer responsive to flow of a current along the spin orbit torque metal layer.

In another particular aspect, an apparatus includes means for indicating a logical value based on an orientation of a magnetization of a layer of the means for indicating. The apparatus further includes means for inducing a spin orbit torque responsive to flow of an in-plane current along the means for inducing. The means for inducing is coupled to the means for indicating a logical value. The apparatus further includes means for generating a random number at least partially based on a state of the means for indicating.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a block diagram of a particular illustrative embodiment of a SOT-driven perpendicular magnetic tunnel junction (MTJ) random number generator during application of a current to a spin orbit torque metal layer. The SOT-driven perpendicular MTJ random number generator includes a perpendicular MTJ that includes a free layer. An orientation of a magnetization of the free layer is substantially in-plane;

FIG. 2 is a block diagram of a particular illustrative embodiment of the SOT-driven perpendicular magnetic tunnel junction random number generator of FIG. 1 while the current of FIG. 1 is not applied to the spin orbit torque metal layer and in the absence of a bias magnetic field. A magnetization of the free layer is in a first perpendicular orientation;

FIG. 3 is a block diagram of a particular illustrative embodiment of the SOT-driven perpendicular magnetic tunnel junction random number generator of FIG. 1 while the current of FIG. 1 is not applied to the spin orbit torque metal layer and in the absence of a bias magnetic field. A magnetization of the free layer is in a second perpendicular orientation that is different than (e.g., that substantially opposes) the first perpendicular orientation of FIG. 2;

V. DETAILED DESCRIPTION

Figure 1:
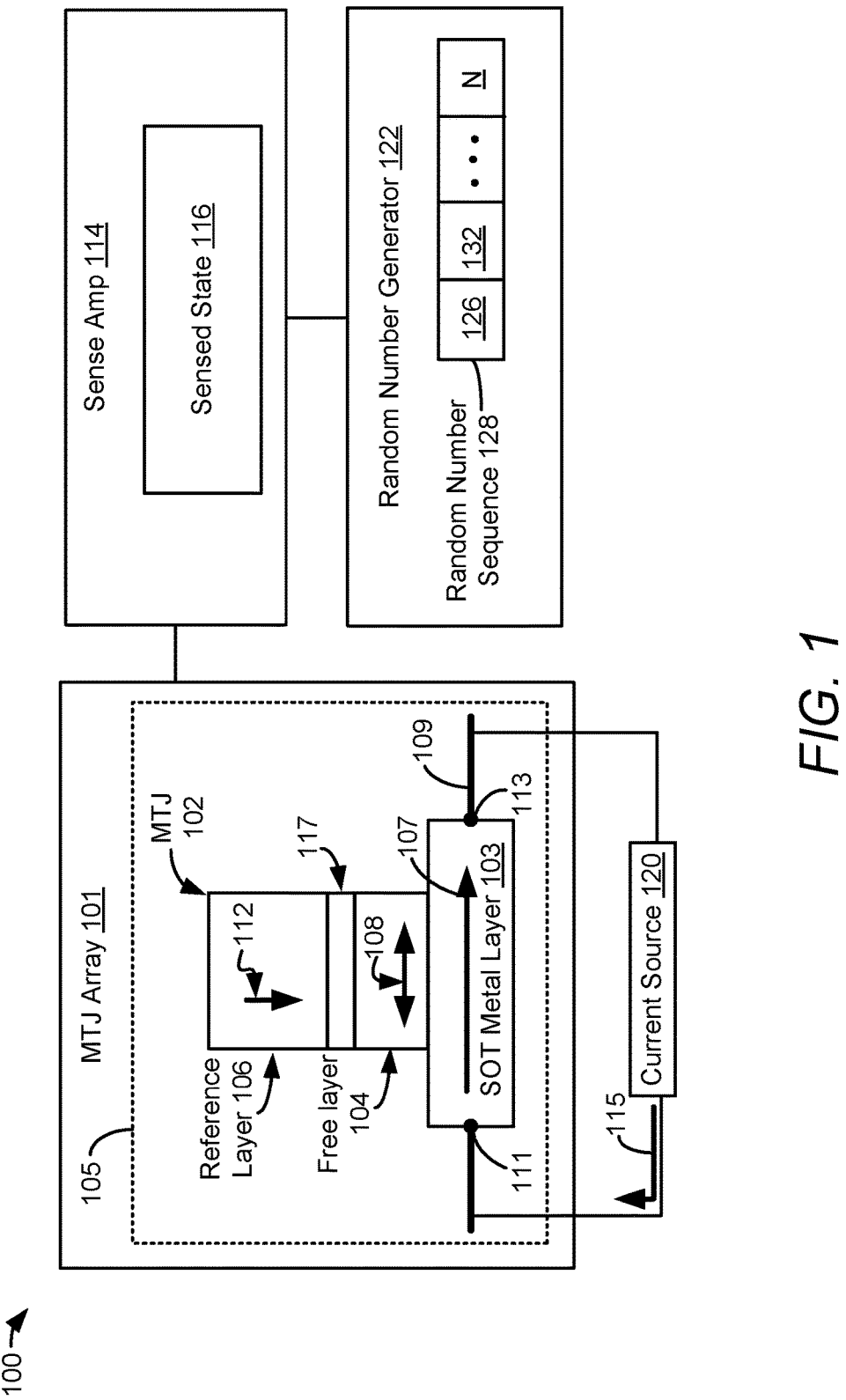

Referring to FIG. 1, a particular illustrative embodiment of an apparatus including a spin orbit torque (SOT)-driven perpendicular magnetic tunnel junction (MTJ) device 105 (that includes a spin orbit torque metal layer 103) and a random number generator 122 configured to generate a random number based on a state of the SOT-driven perpendicular MTJ device 105 is disclosed and generally designated 100. The SOT-driven perpendicular MTJ device 105 may be part of a MTJ array 101 that includes multiple SOT-driven perpendicular MTJ devices as described below in more detail with reference to FIG. 4.

In the example illustrated in FIG. 1, the apparatus 100 includes a current source 120. The current source 120 is coupled (e.g., via a word line 109) to a first node 111 of the spin orbit torque metal layer 103 and to a second node 113 of the spin orbit torque metal layer 103. The current source 120 may be configured to apply a current (e.g., a write or program current) 115 to the spin orbit torque metal layer 103. Application of the current 115 to the spin orbit torque metal layer 103 may cause a current (e.g., an in-plane current) to flow (e.g., a current flow 107) along the spin orbit torque metal layer 103.

The SOT-driven perpendicular MTJ device 105 includes a perpendicular MTJ 102. The perpendicular MTJ 102 is coupled to the spin orbit torque metal layer 103 and includes a reference layer (a ferromagnetic layer) 106, an insulator/oxide layer 117, and a free layer 104 (a ferromagnetic layer). The insulator/oxide layer 117 may be formed of or include magnesium oxide (MgO). The free layer 104 and the reference layer 106 may be formed of or include a ferromagnetic material, such as cobalt iron boron. A magnetization 112 of the reference layer 106 may be fixed or pinned. A magnetization 108 of the free layer 104 may be free to change as described in more detail below. Although the magnetization 112 of the reference layer 106 is illustrated as oriented in a direction toward the spin orbit torque metal layer 103, in other examples the magnetization 112 may be oriented away from the spin orbit torque metal layer 103.

The spin orbit torque metal layer 103 may be substantially non-magnetic (e.g., may not exhibit ferromagnetism or magnetic anisotropy). The spin orbit torque metal layer 103 may be configured to change a magnetization 108 state (e.g., to change an orientation of the magnetization 108) of the free layer 104 responsive to a current flow (e.g., the current flow 107) along the spin orbit torque metal layer 103. The current flow 107 along the spin orbit torque metal layer 103 may induce a spin orbit torque (e.g., an in-plane spin orbit torque) in electrons of the spin orbit torque metal layer 103. The spin orbit torque may be applied to, exerted on, transferred to, or transported to, the free layer 104. Thus, the spin orbit torque metal layer 103 may be configured to apply, exert, transfer, or transport, spin orbit torque on or to the free layer 104 responsive to the current flow 107. Application, exertion, transfer, or transport, of the spin orbit torque on or to the free layer 104 responsive to the current flow 107 may cause the magnetization 108 of the free layer 104 to change orientation (e.g., causing the magnetization 108 state to change). For example, when the current 115 is not applied to the spin orbit torque metal layer 103, the orientation of the magnetization 108 of the free layer 104 (e.g., the magnetization 108 state) may be substantially perpendicular to the spin orbit torque metal layer 103 (and thus the MTJ 102 is referred to as a perpendicular MTJ). In response to application of the current 115, the magnetization 108 of the free layer 104 may change (temporarily) to a substantially in-plane orientation (e.g., the magnetization 108 state may change to a substantially in-plane state or to a substantially in-plane magnetization).

To illustrate, FIG. 1 shows an example of an orientation of the magnetization 108 of the free layer 104 while the current 115 is applied (e.g., during a first time period). Spin transport (from the spin orbit torque metal layer 103 to the free layer 104) by spin orbit coupling induced by application of the current 115 causes the orientation of the magnetization 108 of the free layer 104 to change from substantially perpendicular to substantially parallel to the spin orbit torque metal layer 103. Thus, application of the current 115 may change (temporarily) the orientation of the magnetization 108 (e.g., the magnetization 108 state) of the free layer 104 from substantially perpendicular (e.g., from a substantially perpendicular magnetization) to substantially in-plane (e.g., to a substantially in-plane magnetization) based on in-plane-current-induced spin transport by spin orbit coupling.

Figure 2:
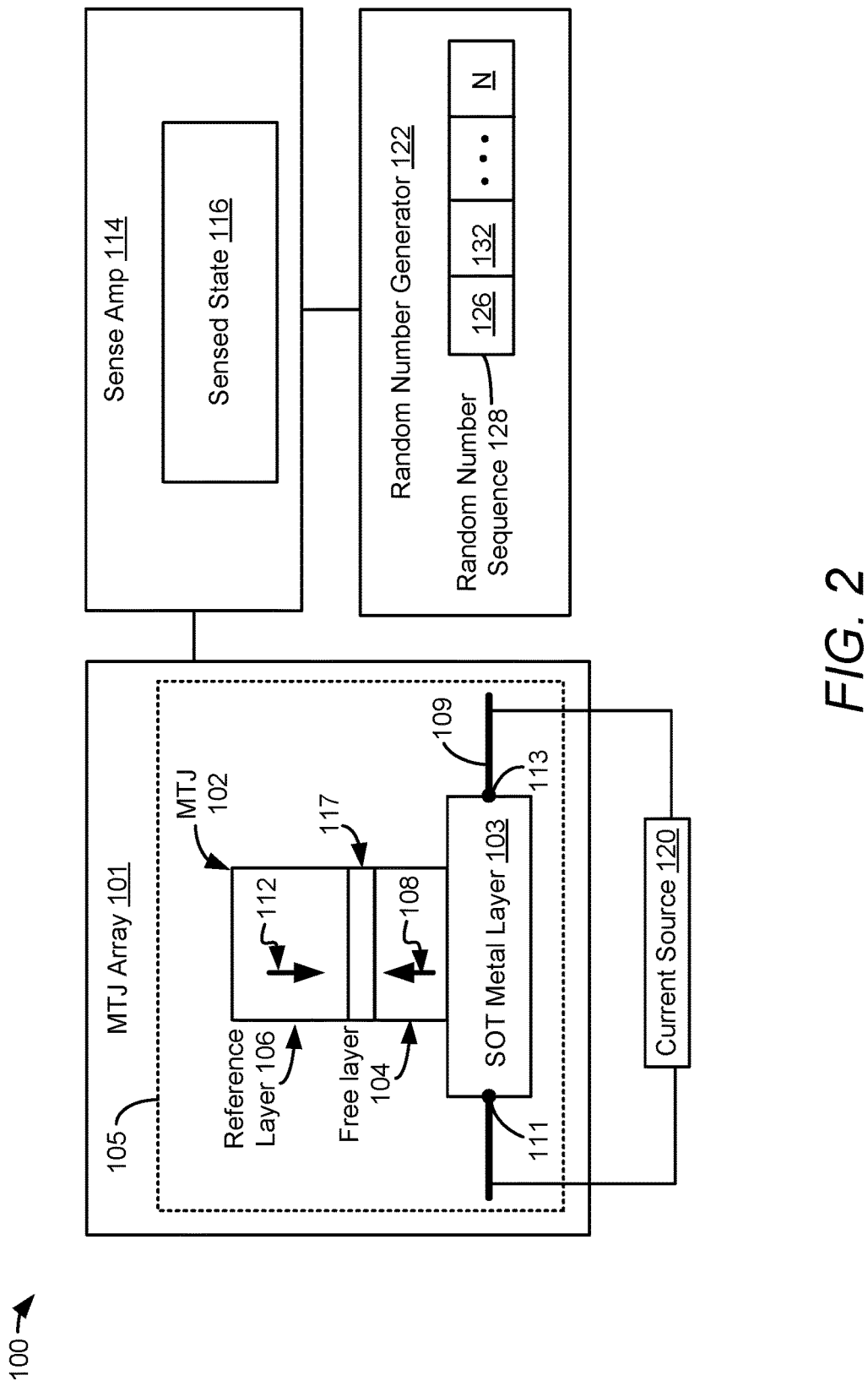
Figure 3:
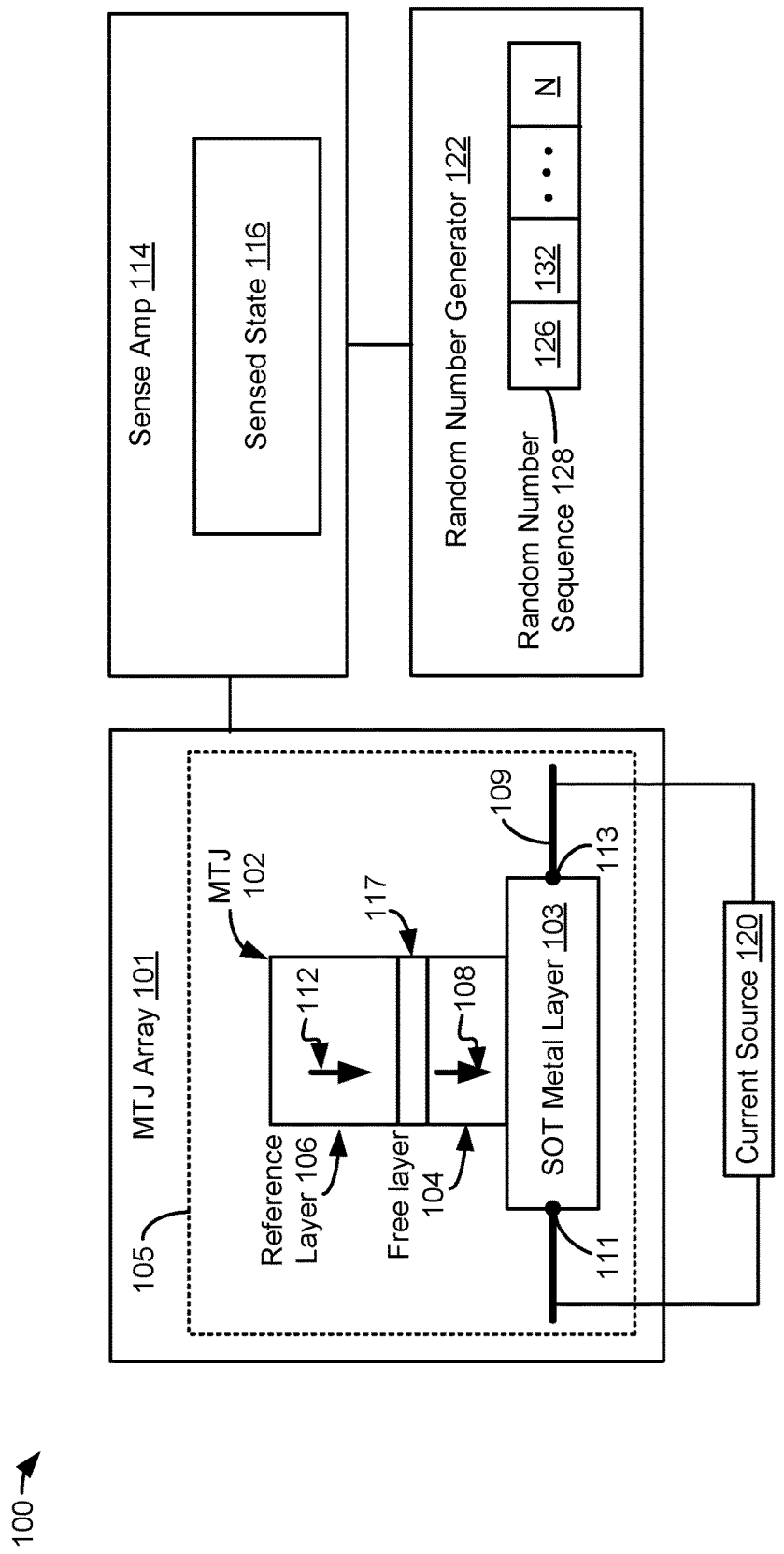

Application of the current 115 may be discontinued during a second time period following the first time period. Upon, subsequent to, or responsive to, discontinuation of application of the current 115, the orientation of the magnetization 108 of the free layer 104 may change from substantially in-plane to substantially perpendicular (e.g., the magnetization 108 state may change). To illustrate, FIGS. 2 and 3 show examples of potential magnetization 108 states of the free layer 104 while the current 115 is not applied. In FIG. 2, the orientation of the magnetization 108 is illustrated as being in the up direction (e.g., an anti-parallel state relative to the example magnetization 112 of the reference layer 106 in FIGS. 1-3) and in FIG. 3 the orientation of the magnetization 108 is illustrated as being in the down direction (e.g., a parallel state relative to the example magnetization 112 of the reference layer 106 in FIGS. 1-3). The perpendicular MTJ 102 is configured such that upon, subsequent to, or responsive to, discontinuation of application of the current 115 and in the absence of application of a bias magnetic field (e.g., an external magnetic field intended to bias the perpendicular MTJ 102) to the perpendicular MTJ 102, the magnetization 108 has a substantially equal probability of settling in the orientation illustrated in FIG. 2 as of settling in the orientation illustrated in FIG. 3. Thus, the perpendicular MTJ 102 is configured to settle, with substantially equal probability, in a first perpendicular orientation or in a second perpendicular orientation upon, subsequent to, or responsive to, discontinuation of application of the current 115.

The orientation of the magnetization 108 of the free layer 104 responsive to application and discontinuation of the current 115 (e.g., responsive to a write operation) represents, corresponds to, or is referred to herein as, a state of the perpendicular MTJ 102. For example, the orientation of the magnetization 108 of FIG. 2 corresponds to an anti-parallel state and the orientation of the magnetization 108 of FIG. 3 corresponds to a parallel state. The anti-parallel state may present a higher resistance than the parallel state responsive to a read current or voltage. Each state (e.g., the parallel state and the anti-parallel state) of the perpendicular MTJ 102 is associated with a logical value stored by the perpendicular MTJ 102. For example, the anti-parallel state illustrated in FIG. 2 may be associated with a logical value of zero (0) stored by the perpendicular MTJ 102, and the parallel state illustrated in FIG. 3 may correspond to a second state associated with a logical value of one (1) stored by the perpendicular MTJ 102. The perpendicular MTJ 102 is therefore configured to substantially randomly store a first logical value or a second logical value responsive to application and discontinuation of the current 115 (e.g., responsive to a write operation). Thus, a write operation performed on the SOT-driven perpendicular MTJ device 105 may substantially randomly orient a magnetization of (e.g., program) the perpendicular MTJ 102.

In the example illustrated in FIG. 1, the apparatus 100 includes a sense amplifier 114 to sense a state (e.g., a sensed state 116) of the perpendicular MTJ 102 based on the resistance of the perpendicular MTJ 102. For example, sense amplifier 114 may sense the anti-parallel state of the perpendicular MTJ 102 based on the MTJ 102 exhibiting a resistance associated with the anti-parallel state. Alternatively or additionally, the sense amplifier 114 may sense the parallel state of the perpendicular MTJ 102 based on the perpendicular MTJ 102 exhibiting a resistance associated with the parallel state. The sense amplifier 114 may provide a signal to the random number generator 122 indicative of the sensed state 116 of the perpendicular MTJ 102. For example, the sense amplifier 114 may provide a first signal to the random number generator 122 when the sensed state 116 corresponds to the anti-parallel state and may provide a second signal to the random number generator 122 when the sensed state corresponds to the parallel state.

The random number generator 122 may be configured to generate a random number based on a state (e.g., the sensed state 116) of the perpendicular MTJ 102. For example, the sense amplifier 114 may sense a first state corresponding to the first logical value (e.g., the sensed state 116 may correspond to the first logical value). The random number generator 122 may determine a first value for the random number or bit when the sensed state 116 corresponds to the first logical value. As another example, the sense amplifier 114 may sense a second state corresponding to the second logical value (e.g., the sensed state 116 may correspond to the second logical value). The random number generator 122 may determine a second value for the number or bit when the sensed state 116 corresponds to the second logical value.

To illustrate, the current 115 may be applied during a first time period, causing the orientation of the magnetization 108 to be substantially in-plane as in FIG. 1. Upon, subsequent to, or responsive to, discontinuation of the current 115 (e.g., during a second time period following the first time period), the magnetization 108 may settle in the orientation illustrated in FIG. 2 corresponding to the anti-parallel state (e.g., associated with a first logical value). Although the magnetization 108 is described as settling in the orientation illustrated in FIG. 2 during the second time period, the magnetization 108 has substantially equal probability of settling in the orientation illustrated in FIG. 3 during the second time period. Thus, in the following description the orientation in FIG. 2 is used for the second time period only as an example. The sense amplifier 114 may sense the anti-parallel state based on the orientation of the magnetization 108 illustrated in FIG. 2 (e.g., based on detecting a resistance associated with the anti-parallel state) during or subsequent to the second time period. The random number generator 122 may generate a random number (e.g., a value of a bit 126 of a random number sequence 128) based on the sensed first state. As an example, the random number generator 122 may generate a bit having a first logical value based on the perpendicular MTJ 102 being sensed as having the first state (based on the orientation of the magnetization 108).

The current 115 may subsequently be applied during a third time period following the second time period, causing the magnetization 108 to change from the orientation illustrated in FIG. 2 to a substantially in-plane orientation (e.g., as illustrated in FIG. 1). Upon, subsequent to, or responsive to, discontinuation of the current 115 (e.g., during a fourth time period following the third time period), the magnetization 108 may settle in the orientation illustrated in FIG. 3 corresponding to the parallel state (associated with a second logical value). Although the magnetization 108 is described as settling in the orientation illustrated in FIG. 3 during the fourth time period, the magnetization 108 has substantially equal probability of settling in the orientation illustrated in FIG. 2 during the fourth time period. Thus, in the following description the orientation in FIG. 3 is selected for the fourth time period only as an example. The sense amplifier 114 may sense the parallel state based on the orientation of the magnetization 108 illustrated in FIG. 3 during or subsequent to the fourth time period. The random number generator 122 may generate a random number (e.g., a value of a bit 132 of the random number sequence 128) based on the sensed second state. As an example, the random number generator 122 may generate the bit 132 having the second logical value based on the perpendicular MTJ 102 being sensed as having the second state (based on the orientation of the magnetization 108).

Thus, the random number generator 122 may generate one or more numbers based at least in part on sensed states of the perpendicular MTJ 102 of the SOT-driven perpendicular MTJ device 105. Because the perpendicular MTJ 102 has an equal probability of settling in a first state corresponding to a first logical value or in a second state corresponding to a second logical value responsive to a current (e.g., a write current), the one or more generated numbers are random.

In comparison to spin transfer torque (STT)-driven MTJ device based random number generators, a low voltage may be applied to the insulator/oxide layer of the perpendicular MTJ 102 to write each random logical value to the perpendicular MTJ 102. For example, STT-driven MTJ device based random number generators may apply a voltage across the STT-driven MTJ device to generate a current through the insulator/oxide layer of the STT-driven MTJ device. The examples illustrated in FIGS. 1-3 may employ a relatively small current (e.g., 100 microamps) applied along the spin orbit torque metal layer 103 and the voltage across the insulator/oxide layer 117 may be much smaller than the voltage applied to the insulator layer of MTJs of STT-driven perpendicular MTJ device based random number generators. Applying less voltage to across the insulator/oxide layer 117 may increase a life of the insulator/oxide layer 117 and thus a life of the perpendicular MTJ 102. Thus, using the SOT-driven perpendicular MTJ device 105 to generate random numbers may increase a life of an MTJ of a MTJ-based random number generator relative to the life of an MTJ of an STT-driven perpendicular MTJ device based random number generator.

Although a single perpendicular MTJ is illustrated in FIGS. 1-3, in some examples the MTJ array 101 includes multiple perpendicular MTJs per word line. In these examples, more than one perpendicular MTJ of a word line may be programmed by applying and discontinuing the current 115 to the word line. As an example, the MTJ array 101 may include eight (8) perpendicular MTJs along the word line 109 (e.g., may include eight (8) perpendicular MTJs coupled to the SOT metal layer 103). By applying and discontinuing the current 115 to the word line 109 during the first time period and the second time period, respectively, the eight (8) perpendicular MTJs coupled to the word line 109 may be randomly programmed to either the first state (e.g., corresponding to a first logical value) or the second state (e.g., corresponding to the second logical value). In this example, the random number generator 122 may generate a random number such that each bit of the random number is based on a state of a corresponding perpendicular MTJ of the eight (8) perpendicular MTJs (e.g., may generate an eight (8)-bit random number based on the 8 logical values stored by the 8 MTJs). For example, the eight (8) perpendicular MTJs may collectively store logical values corresponding to a number ranging anywhere from zero (e.g., 00000000) to 255 (e.g., 11111111). Thus, in this example, an eight (8)-bit random number may be generated by applying and discontinuing the current to the word line 109.

Alternatively or additionally, fewer than all of the perpendicular MTJs of a single word line may be concurrently programmed by application and discontinuation of a current to the word line. For example, as described in more detail below with reference to FIG. 4, a perpendicular MTJ of a word line may be programmed by applying and discontinuing the current to the word line while keeping the impedance of a bit line coupled to the perpendicular MTJ at a high impedance. To illustrate using the eight (8) perpendicular MTJ word line example above, four (4) of the eight (8) perpendicular MTJs may be programmed during application and discontinuation of the current by applying and discontinuing the current while keeping the impedance of the bit lines of the four perpendicular MTJs at a high impedance and while not keeping the bit lines of the remaining four perpendicular MTJs of the word line at a high impedance. Thus, in this example, a four (4)-bit random number may be generated by applying and discontinuing the current to the word line 109.

Alternatively or additionally, although the MTJ array 101 is illustrated as including a single word line, in some examples the MTJ array 101 includes multiple word lines with one or more perpendicular MTJs coupled to each of the multiple word lines as described in more detail below with reference to FIG. 4. In these examples, as described in more detail below with reference to FIG. 4, at least one of the one or more perpendicular MTJs of each of the multiple word lines may be concurrently randomly programmed by applying and discontinuing the current 115 to the multiple word lines.

Figure 4:
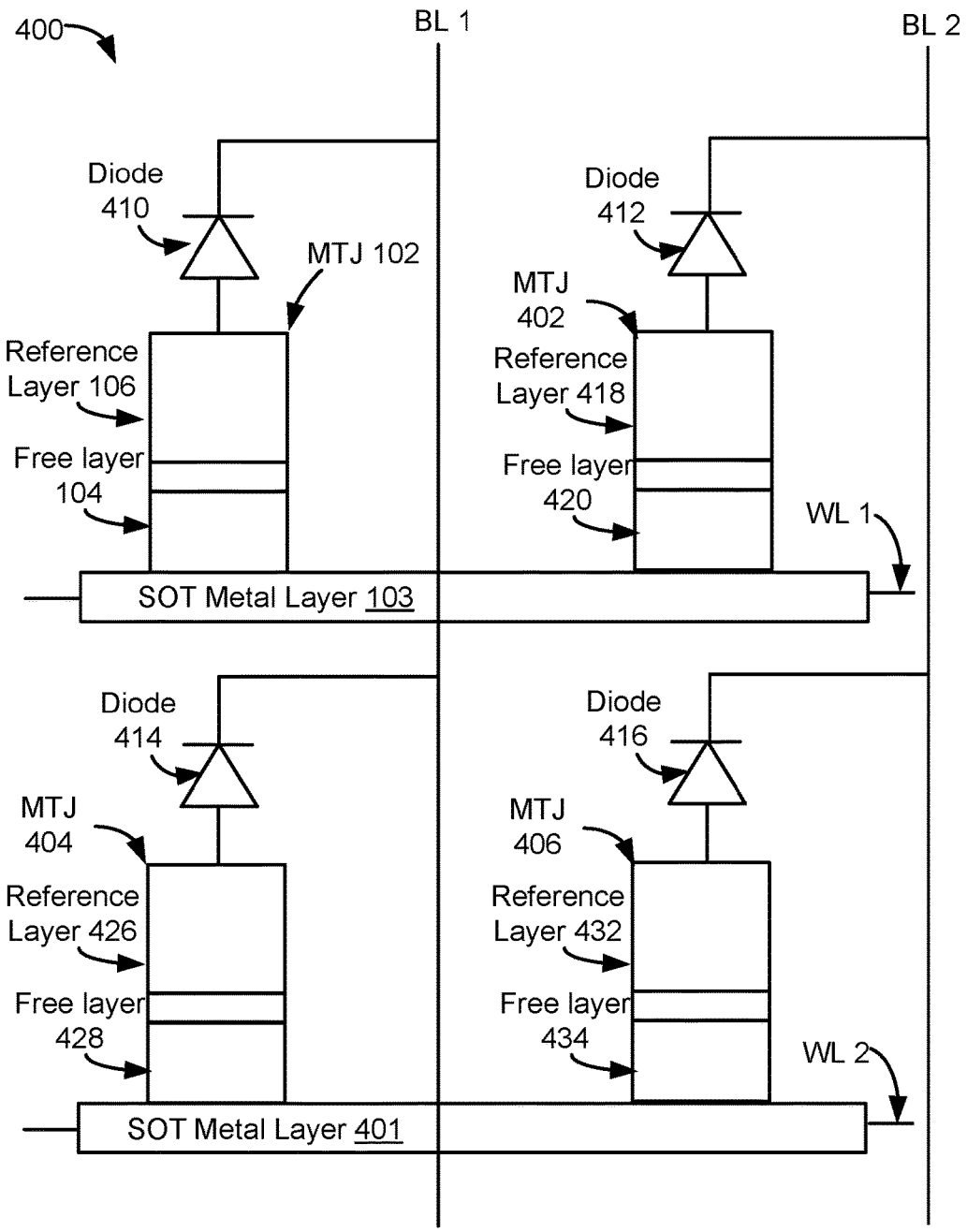
FIG. 4 is a block diagram of a transistor array including multiple perpendicular MTJs coupled to a spin orbit torque metal layer.

FIG. 4 illustrates a MTJ array 400 including multiple perpendicular MTJs coupled to a spin orbit torque metal layer. The MTJ array 400 may correspond to the MTJ array 101 of FIGS. 1-3.

The MTJ array 400 includes multiple perpendicular MTJs coupled to a first spin orbit torque metal layer. For example, the multiple perpendicular MTJs include the perpendicular MTJ 102 of FIG. 1 (e.g., a first perpendicular MTJ) coupled to the spin orbit torque metal layer 103 of FIG. 1 and one or more additional perpendicular MTJs such as a perpendicular MTJ (e.g., a second perpendicular MTJ) 402 coupled to the spin orbit torque metal layer 103. The one or more additional perpendicular MTJs include a free layer and a reference layer. For example, the perpendicular MTJ 402 includes a free layer (e.g., a second free layer) 420 and a reference layer 418. The MTJ array 400 additionally includes a word line (e.g., a first word line) WL 1 coupled to the spin orbit torque metal layer 103. Thus, the MTJ array 400 includes multiple perpendicular MTJs coupled to the word line WL 1. The word line WL 1 may correspond to the word line 109 of FIG. 1.

Although FIG. 4 illustrates the MTJ array 400 as including two perpendicular MTJs 102 and 402 coupled to the word line WL 1, the MTJ array 400 may include more than two perpendicular MTJs coupled to the word line WL 1. As an example, the MTJ array 400 may include P (where P>2) MTJs coupled to the word line WL 1. To illustrate, the MTJ array 400 may include eight (8) perpendicular MTJs coupled to the word line WL 1 as described above.

The MTJ array 400 additionally includes a bit line (e.g., a first bit line) BL 1. The MTJ array 400 additionally includes a diode (e.g., a first diode) 410 coupled between the perpendicular MTJ 102 and the bit line BL 1. The MTJ array 400 includes one or more additional bit lines such as a bit line (e.g., a second bit line) BL 2. The MTJ array 400 includes one or more additional diodes such as a diode (e.g., a second diode) 412 coupled between the one or more additional perpendicular MTJs (e.g., the perpendicular MTJ 402) and the one or more bit lines (e.g., the bit line BL 2). Although the MTJ array 400 is illustrated as including two bit lines, the MTJ array 400 may include more than two bit lines (e.g., may include N bit lines). To illustrate, the MTJ array 400 may include eight (8) perpendicular MTJs coupled to the word line WL 1 and may include eight (8) bit lines such that each bit line of the 8 bit lines is coupled to a respective perpendicular MTJ of the eight (8) perpendicular MTJs. In this example, the MTJ array 400 includes eight diodes, and each of the eight diodes is coupled between a respective perpendicular MTJ of the eight (8) perpendicular MTJs and a bit line of the eight (8) bit lines.

The multiple perpendicular MTJs coupled to the word line WL 1 (e.g., the perpendicular MTJs 102 and 402 or the P perpendicular MTJs) are configured to be written with a random logical value (as described above with reference to FIGS. 1-3) by applying a current to the word line WL 1 while keeping the bit lines coupled to the multiple perpendicular MTJs (e.g., the bit lines BL 1 and BL 2) at a high impedance. Application of the write current (e.g., during a first time period) to the word line WL 1 induces a current flow (an in-plane current flow) along the spin orbit torque metal layer 103 as described above with reference to FIG. 1. The induced current flow causes the magnetization of the free layers of the multiple perpendicular MTJs coupled to the spin orbit torque metal layer 103 (e.g., the free layers 104 and 420) to change states from a substantially perpendicular orientation to a substantially in-plane orientation as described above with reference to the current flow 107 and the magnetization 108 of FIG. 1. Upon discontinuation of the write current (e.g., during a second time period), the magnetization of each of the free layers of the multiple perpendicular MTJs coupled to the spin orbit torque metal layer 103 (e.g., the free layers 104 and 420) may substantially randomly settle in any one of multiple potential perpendicular orientations (e.g., any one of multiple potential states) as described above with reference to FIGS. 2 and 3. For example, upon discontinuation of the current and in the absence of a bias magnetic field applied to the perpendicular MTJs 102 and 402, the magnetization of the free layer 104 may settle in a first orientation (e.g., an orientation in the down direction) and the magnetization of the free layer 420 may settle in a second orientation (e.g., an orientation in the up direction). In examples in which the MTJ array 400 includes P (where P>2) perpendicular MTJs coupled to the word line WL 1, application and discontinuation of the current to the word line WL 1 in the absence of a bias magnetic field causes the magnetization of the free layers of the P perpendicular MTJs coupled to the word line WL 1 to substantially randomly settle in any one of the multiple perpendicular orientations.

Thus, the MTJ array 400 includes multiple perpendicular MTJs coupled to a spin orbit torque metal layer. The perpendicular MTJs coupled to the spin orbit torque metal layer may be concurrently or simultaneously written with random logical values by application (and discontinuation) of a write current applied to the spin orbit torque metal layer (via a single word line) in the absence of a bias magnetic field.

The state of each of the multiple perpendicular MTJs coupled to the word line WL 1 (e.g., the perpendicular MTJs 102 and 402) may be read by applying a read voltage to the word line WL 1 while keeping a bit line coupled to the perpendicular MTJ at ground. For example, the perpendicular MTJ 102 may be read by applying the read voltage to the word line WL 1 while keeping the bit line BL 1 at ground and the perpendicular MTJ 402 may be read by applying the read voltage to the word line WL 1 while keeping the bit line BL 2 at ground.

A random number generator (such as the random number generator 122 of FIGS. 1-3) may generate a random number based on the random logical values concurrently written to the perpendicular MTJs coupled to the word line WL 1. For example, the random number generator 122 may generate a two (2)-bit random number based on the random logical values concurrently written to the perpendicular MTJs 102 and 402. In examples in which the MTJ array 400 includes P (where P>2) perpendicular MTJs coupled to the word line WL 1, the random number generator 122 may generate a P-bit random number based on the P random logical values concurrently written to the P perpendicular MTJs. For example, the MTJ array 400 may include eight (8) perpendicular MTJs coupled to the word line WL 1, the eight (8) perpendicular MTJs may be concurrently written with random logical values as described above, and the random number generator 122 may generate an eight (8)-bit random number based on the random logical values concurrently written to the eight (8) perpendicular MTJs.

The MTJ array 400 includes multiple perpendicular MTJs coupled to a second spin orbit torque metal layer 401. For example, the MTJ array 400 includes a perpendicular MTJ (e.g., a third perpendicular MTJ) 404 and includes a perpendicular MTJ (e.g., a fourth perpendicular MTJ) 406 coupled to the spin orbit torque metal layer 401. The perpendicular MTJ 404 includes a free layer (e.g., a third free layer) 428 and a reference layer 426. The perpendicular MTJ 404 is coupled to the bit line BL 1. The perpendicular MTJ 406 includes a free layer (e.g., a fourth free layer) 434 and a reference layer 432. The perpendicular MTJ 406 is coupled to the bit line BL 2.

The MTJ array 400 additionally includes a word line (e.g., a second word line) WL 2 coupled to the spin orbit torque metal layer 401. Thus, the MTJ array 400 includes multiple perpendicular MTJs coupled to the word line WL 2. Although FIG. 4 illustrates the MTJ array 400 as including two perpendicular MTJs 404 and 406 coupled to the word line WL 2, the MTJ array 400 may include more than two perpendicular MTJs coupled to the word line WL 2. As an example, the MTJ array 400 may include P (where P>2) perpendicular MTJs coupled to the word line WL 2. To illustrate, the MTJ array 400 may include eight (8) perpendicular MTJs coupled to the word line WL 2.

The MTJ array 400 additionally includes a diode (e.g., a third diode) 414 coupled between the perpendicular MTJ 404 and the bit line BL 1 and includes a diode 416 coupled between the perpendicular MTJ 406 and the bit line BL 2. The diodes 410 412, 414, and 416 may each prevent current flowing from a corresponding perpendicular MTJ (coupled to a first word line or spin orbit torque metal layer) to a bit line from leaking into a perpendicular MTJ coupled to a different word line or spin orbit torque metal layer. For example, the diode 414 may prevent or limit current that flows from the perpendicular MTJ 102 to the bit line BL 1 from flowing into the perpendicular MTJ 404. As another example, the diode 410 may prevent or limit current that flows from the perpendicular MTJ 404 to the bit line BL 1 from flowing into the perpendicular MTJ 102. As another example, the diode 416 may prevent or limit current that flows from the perpendicular MTJ 402 to the bit line BL 2 from flowing into the perpendicular MTJ 406. As another example, the diode 412 may prevent or limit current that flows from the perpendicular MTJ 406 to the bit line BL 2 from flowing into the perpendicular MTJ 402.

Although the MTJ array 400 is illustrated as including two (2) bit lines, two (2) word lines, and two (2) spin orbit torque metal layers, the MTJ array 400 may include more than two (2) bit lines (e.g., may include N bit lines where N>2), more than two (2) word lines (e.g., may include M word lines where M>2), more than two (2) spin orbit torque metal layers (e.g., may include M spin orbit torque metal layers where M>2), or a combination thereof. Each of the M word lines may be coupled to a respective one of the M spin orbit torque metal layers. Each of the M spin orbit torque metal layers may be coupled to multiple perpendicular MTJs as described above (e.g., with reference to the perpendicular MTJs 102, 402, 404, or 406). Each of the multiple perpendicular MTJs is coupled to one of the N bit lines and includes a diode between the perpendicular MTJ and the bit line to which the perpendicular MTJ is coupled.

To illustrate, the MTJ array 400 may include eight (8) perpendicular MTJs coupled to the word line WL 1, eight (8) perpendicular MTJs coupled to the word line WL 2, and eight (8) perpendicular MTJs coupled to a third word line [not illustrated] (e.g., the MTJ array 400 includes 24 perpendicular MTJs). In this example, the MTJ array 400 may include eight (8) bit lines such that each bit line of the eight (8) bit lines is coupled to three perpendicular MTJs (e.g., one perpendicular MTJ per each of the three word lines). In this example, the MTJ array 400 includes twenty four (24) diodes, and each of the twenty four (24) diodes is coupled between a respective perpendicular MTJ of the twenty four (24) perpendicular MTJs and a bit line of the eight (8) bit lines.

The multiple perpendicular MTJs coupled to the word line WL 2 (e.g., the perpendicular MTJs 404 and 406 or the P perpendicular MTJs) are configured to be written with a random logical value (as described above with reference to FIGS. 1-3) by applying a current to the word line WL 2 while keeping the bit lines coupled to the multiple perpendicular MTJs coupled to the word line WL 2 (e.g., the bit lines BL 1 and BL 2) at a high impedance. Application of the write current (e.g., during a first time period) to the word line WL 2 induces a current flow (an in-plane current flow) along the spin orbit torque metal layer 401 as described above with reference to FIG. 1. The induced current flow causes the magnetization of the free layers of the multiple perpendicular MTJs coupled to the word line WL 2 (e.g., the free layers 428 and 434) to change states from a substantially perpendicular orientation to a substantially in-plane orientation as described above with reference to the current flow 107 and the magnetization 108 of FIG. 1. Upon discontinuation of the write current (e.g., during a second time period), the magnetization of each of the free layers of the multiple perpendicular MTJs coupled to the word line WL 2 (e.g., the free layers 428 and 434) may substantially randomly settle in any one of multiple potential perpendicular orientations (e.g., any one of multiple potential states) as described above with reference to FIGS. 2 and 3. For example, upon discontinuation of the current and in the absence of a bias magnetic field applied to the perpendicular MTJs 404 and 406, the magnetization of the free layer 428 may settle in a first orientation (e.g., an orientation in the down direction) and the magnetization of the free layer 434 may settle in a second orientation (e.g., an orientation in the up direction). In examples in which the MTJ array 400 includes P (where P>2) perpendicular MTJs coupled to the word line WL 2, application and discontinuation of the current to the word line WL 2 in the absence of a bias magnetic field causes the magnetization of the free layers of the P perpendicular MTJs coupled to the word line WL 2 to substantially randomly settle in any one of the multiple perpendicular orientations.

Thus, the MTJ array 400 includes multiple perpendicular MTJs coupled to a second spin orbit torque metal layer. The perpendicular MTJs coupled to the second spin orbit torque metal layer may be concurrently or simultaneously written with random logical values by application (and discontinuation) of a write current applied to the spin orbit torque metal layer (via a single word line) in the absence of a bias magnetic field.

In some examples, one or more perpendicular MTJs coupled to the word line WL 1 and one or more perpendicular MTJs coupled to the word line WL 2 may be concurrently written with random logical values by concurrent application (and subsequent discontinuation) of a write current to the first and second word lines WL 1 and WL 2. For example, the perpendicular MTJs 102, 402, 404, and 406 may be concurrently written with random logical values by concurrent application (and subsequent discontinuation) of a write current to the first and second word lines WL 1 and WL 2. Thus, the MTJ array 400 may be configured to concurrently program four (4) perpendicular MTJs with random logical values (e.g., may generate four (4) random logical values) by application and discontinuation of the current to the first and second word lines WL 1 and WL 2.

In examples in which the MTJ array 400 includes M (where M>2) word lines, one or more of the multiple perpendicular MTJs coupled to each of the M word lines may be concurrently written with random logical values by concurrent application (and subsequent discontinuation) of a write current to the M word lines in the absence of a bias magnetic field. For example, the MTJ array 400 may include sixty four (64) word lines, sixty four (64) spin orbit torque metal layers (where each spin orbit torque is coupled to a respective word line of the 64 word lines), and eight (8) perpendicular MTJs coupled to each of the sixty four (64) spin orbit torque metal layers (e.g., 64×8=512 perpendicular MTJs). In this example, each of the 512 perpendicular MTJs may be concurrently written with a random logical value by concurrent application (and subsequent discontinuation) of a write current to the sixty four (64) word lines. Alternatively or additionally, less than all of the multiple perpendicular MTJs of a word line may be concurrently written with random logical values. To illustrate using the above example MTJ array including sixty four (64) word lines and eight (8) perpendicular MTJs per word line, in some examples four (4) bit lines (e.g., coupled to 4 perpendicular MTJs per word line) may be kept at a high impedance while the remaining four (4) bit lines (coupled to the remaining 4 perpendicular MTJs per word line) may not be at a high impedance, and a write current may be concurrently applied to each of the sixty four (64) word lines. In this example, four (4) perpendicular MTJs per word line (e.g., the four perpendicular MTJs coupled to the bit lines kept at a high impedance) may be concurrently written with random logical values (e.g., 256 of the 512 perpendicular MTJs may be concurrently written with random logical values).

The state of each of the multiple perpendicular MTJs coupled to the word line WL 2 (e.g., the perpendicular MTJs 404 and 406) may be read by applying a read voltage to the word line WL 2 while keeping a bit line coupled to the perpendicular MTJ at ground. For example, the perpendicular MTJ 404 may be read by applying the read voltage to the word line WL 2 while keeping the bit line BL 1 at ground and the perpendicular MTJ 406 may be read by applying the read voltage to the word line WL 2 while keeping the bit line BL 2 at ground.

A random number generator (such as the random number generator 122 of FIGS. 1-3) may generate a random number based on the random logical values concurrently written to the multiple perpendicular MTJs coupled to the word line WL 2. For example, the random number generator 122 may generate a two (2)-bit random number based on the logical values concurrently written to the perpendicular MTJs 404 and 406. In examples in which the MTJ array 400 includes P (where P>2) perpendicular MTJs coupled to the word line WL 2, the random number generator 122 may generate an P-bit random number based on the logical values concurrently written to the P perpendicular MTJs. For example, the MTJ array 400 may include eight (8) perpendicular MTJs (e.g., P=8) coupled to the word line WL 2, the eight (8) perpendicular MTJs may be concurrently written with random logical values as described above, and the random number generator 122 may generate an eight (8)-bit random number (e.g., ranging between 00000000 and 11111111) based on the logical values concurrently written to the 8 perpendicular MTJs.

Alternatively or additionally, the random number generator may generate a random number based on logical values concurrently written to one or more perpendicular MTJs of each word line of multiple word lines. For example, as described above, the MTJ array 400 may concurrently write four (4) random logical values to the perpendicular MTJs 102, 402, 404, and 406, and the random number generator may generate a four (4)-bit random number based on the logical values concurrently written to the perpendicular MTJs 102, 402, 404, and 406. As another example, the MTJ array 400 may concurrently write 512 logical values to the 512 perpendicular MTJs described above, and the random number generator may generate a 512-bit random number based on the 512 logical values concurrently written to the 512 perpendicular MTJs. As another example, the MTJ array 400 may concurrently write 256 logical values to the 256 perpendicular MTJs described above, and the random number generator may generate a 256-bit random number based on the 256 logical values concurrently written to the 256 perpendicular MTJs.

Thus, the MTJ array 400 of FIG. 4 enables concurrently writing multiple SOT perpendicular MTJs with random logical values. Each bit of a random number including multiple bits may be based on a random logical value written to one of the multiple perpendicular MTJs. Thus, the MTJ array 400 enables concurrent generation of multiple bits of a random number.

Figure 5:
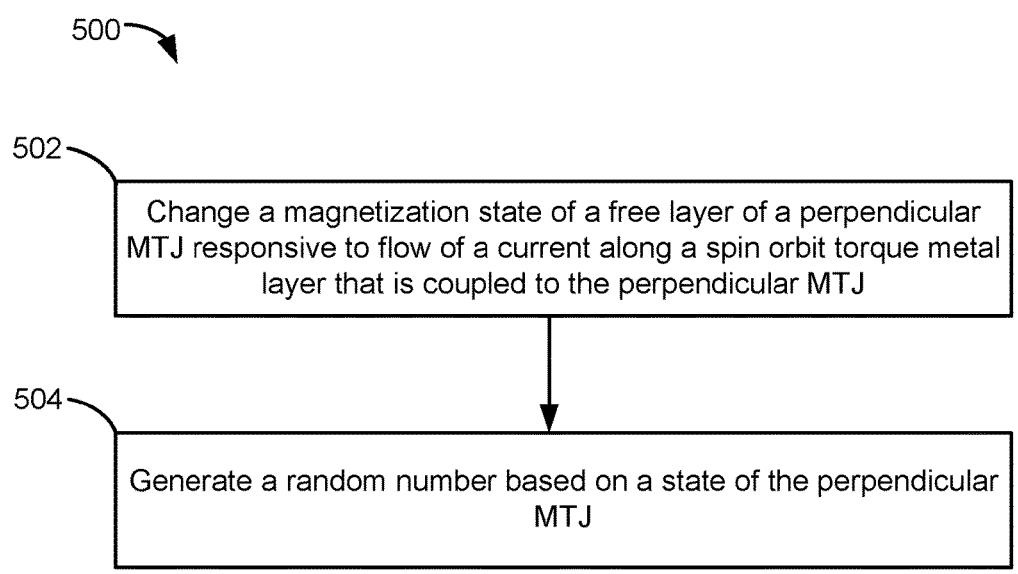
FIG. 5 is a flowchart of an example of a method of generating a random number using an SOT-driven perpendicular MTJ.

FIG. 5 illustrates a flowchart of an example of a method 500 of generating a random number using a SOT-driven perpendicular MTJ device. For example, the SOT-driven perpendicular MTJ device may correspond to the SOT-driven perpendicular MTJ device 105 of FIG. 1, to the perpendicular MTJs 102 and 402 and the spin orbit torque metal layer 103, or to the perpendicular MTJs 404 and 406 and the spin orbit torque metal layer 401.

The method 500 includes, at 502, changing a magnetization state of a free layer of a perpendicular MTJ responsive to flow of a current along a spin orbit torque metal layer that is coupled to the perpendicular MTJ. As an example, the perpendicular MTJ may correspond to the perpendicular MTJ 102 of FIG. 1, the spin orbit torque metal layer may correspond to the spin orbit torque metal layer 103 of FIG. 1, the flow of current may correspond to the current flow 107 of FIG. 1, and the free layer may correspond to the free layer 104 of FIG. 1. The flow of current may be produced responsive to application of current such as the current 115 to a word line, such as the word line 109 of FIG. 1, coupled to the spin orbit torque metal layer. In some examples, changing the magnetization state includes changing (temporarily) an orientation of the magnetization (e.g., the magnetization 108 of FIG. 1) of the free layer from a substantially perpendicular orientation to a substantially in-plane orientation as described above with reference to FIG. 1.

The method 500 includes, at 504, generating a random number based on a state of the perpendicular MTJ. For example, as described above, application of the current (e.g., the current 115 of FIG. 1) to the word line coupled to the spin orbit torque metal layer may be discontinued. The state of the perpendicular MTJ may be sensed by a sense amplifier based on an orientation of the magnetization 108 of the free layer upon, subsequent to, or responsive to, discontinuation of application of the current to the spin orbit torque metal layer (e.g., upon, subsequent to, or responsive to, discontinuation of application of the current to the word line coupled to the spin orbit torque metal layer). As described above with reference to FIGS. 1-3, upon, subsequent to, or responsive to, discontinuation of application of the current and in the absence of application of a bias magnetic field, the magnetization may substantially randomly settle in one of multiple potential perpendicular orientations corresponding to states associated with logical values. Thus, application and discontinuation of the current in the absence of a bias magnetic field may cause the perpendicular MTJ to store a random logical value. A random number generator may receive a sensed state from the sense amplifier and may generate a number based on the sensed state. Because the state of (e.g., the logical value store by) the perpendicular MTJ is random and because the generated value is based on the sensed state, the generated number is substantially random (e.g., is a substantially random number).

Figure 6:
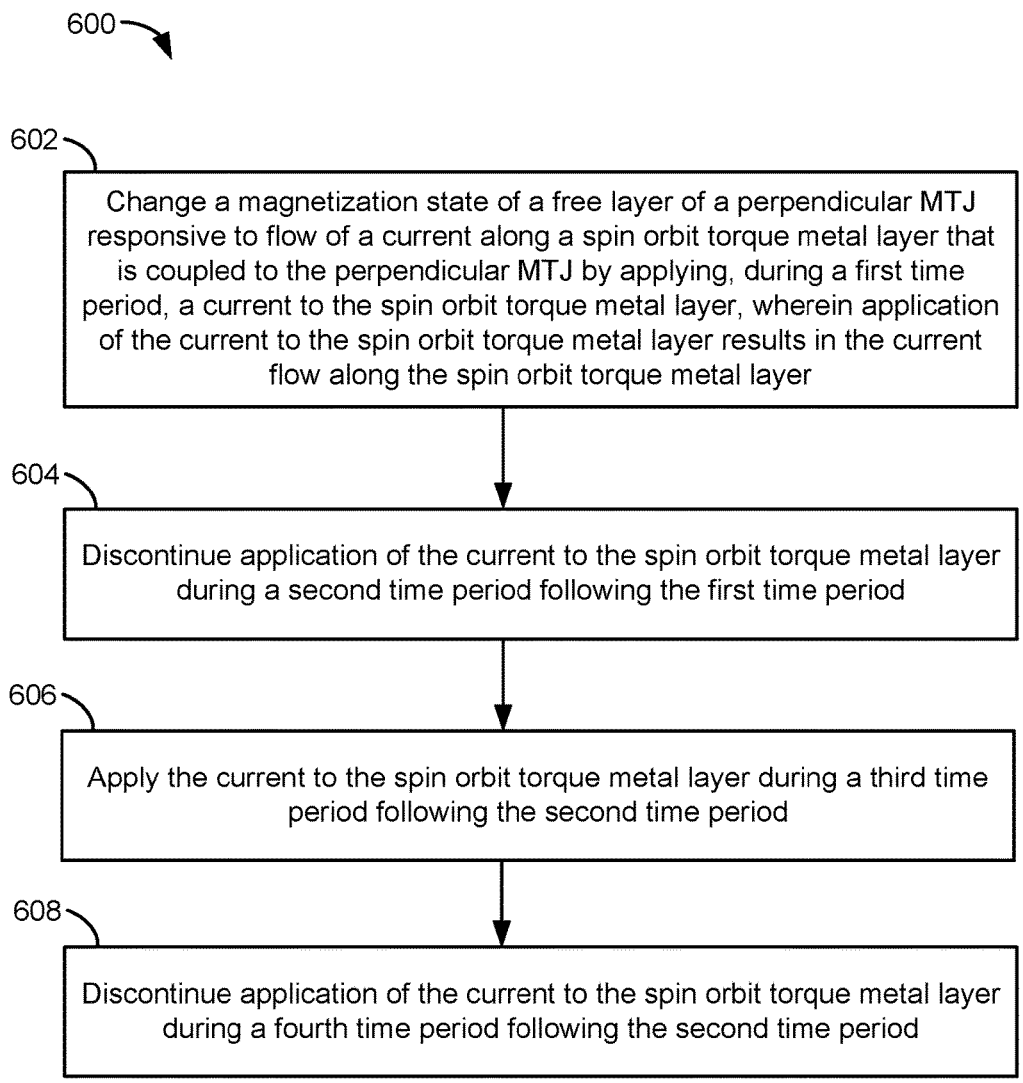
FIG. 6 is a flowchart of an example of a method of generating a random number using an SOT-driven perpendicular MTJ.

FIG. 6 illustrates a flowchart of an example of a method 600 of generating a random number using an SOT-driven perpendicular MTJ device. For example, the SOT-driven perpendicular MTJ device may correspond to the SOT-driven perpendicular MTJ device 105 of FIG. 1.

The method 600 includes, at 602, changing a magnetization state of a free layer of a perpendicular MTJ responsive to flow of a current along a spin orbit torque metal layer that is coupled to the perpendicular MTJ. As an example, the perpendicular MTJ may correspond to the perpendicular MTJ 102 of FIG. 1, the spin orbit torque metal layer may correspond to the spin orbit torque metal layer 103 of FIG. 1, the flow of current may correspond to the current flow 107 of FIG. 1, and the free layer may correspond to the free layer 104 of FIG. 1. In some examples, changing the magnetization state includes changing (temporarily) an orientation of the magnetization (e.g., the magnetization 108 of FIG. 1) of the free layer from a substantially perpendicular orientation to a substantially in-plane orientation as described above with reference to FIG. 1. The magnetization state of the free layer may be changed by applying, during a first time period, a current to the spin orbit torque metal layer. Application of the current to the spin orbit torque metal layer during the first time period may result in the current flow along the spin orbit torque metal layer. For example, the current source 120 of FIG. 1 may apply the current 115 to the spin orbit torque metal layer during the first time period, causing the current flow 107 to flow along the spin orbit torque metal layer.

In some examples, applying, during the first time period, the current to the spin orbit torque metal layer changes a magnetization of a second free layer of a second perpendicular MTJ coupled to the spin orbit torque metal layer responsive to the current flow along the spin orbit torque metal layer. For example, the second perpendicular MTJ coupled to the spin orbit torque metal layer may correspond to the perpendicular MTJ 402 of FIG. 4, and the state of the perpendicular MTJ 402 may be changed from a perpendicular state to an in-plane state (e.g., a magnetization of the free layer 420 may be changed from a perpendicular orientation to an in-plane orientation). Thus, application of the current 115 to the spin orbit torque metal layer may change a state of multiple perpendicular MTJs.

The method 600 includes, at 604, discontinuing application of the current to the spin orbit torque metal layer during a second time period following the first time period. For example, the current source 120 may discontinue application of the current 115 during the second time period in the absence of application of a bias magnetic field as described above with reference to FIGS. 1-3. The magnetization of the free layer may settle in a first perpendicular orientation as described above with reference to FIG. 2. The orientation of the magnetization while the current 115 is not applied corresponds to a state of the perpendicular MTJ, and the state of the perpendicular MTJ is associated with a logical value as described above with reference to FIG. 2. For example, the first perpendicular orientation may correspond to a first state and may be associated with a first logical value. Thus, the perpendicular MTJ may store the first logical value during the second time period (e.g., upon, in response to, or subsequent to, discontinuation of application of the current 115 in the absence of application of the bias magnetic field during the second time period). The state of the perpendicular MTJ during the second time period may be sensed by a sense amplifier (e.g., the sense amplifier may sense the stored first logical value of the perpendicular MTJ), and a random number generator may generate a random number based on the stored first logical value. For example, the random number generator may generate a first value for the bit 126 of FIG. 1 based on the perpendicular MTJ storing the first logical value upon, responsive to, or subsequent to, application and discontinuation of the current 115 in the absence of the bias magnetic field.

The method 600 includes, at 606, changing the magnetization state of the free layer of the perpendicular MTJ responsive to flow of a current along a spin orbit torque metal layer that is coupled to the perpendicular MTJ. As an example, changing (during a third time period subsequent to the second time period) the magnetization state includes changing (temporarily) an orientation of the magnetization 108 of the free layer from the orientation of the perpendicular MTJ during the second time period (e.g., from the first perpendicular orientation of FIG. 2) to a substantially in-plane orientation as described above with reference to FIG. 1. The magnetization state of the free layer may be changed by applying, during the third time period, a current to the spin orbit torque metal layer. Application of the current to the spin orbit torque metal layer may result in the current flow along the spin orbit torque metal layer. For example, the current source 120 of FIG. 1 may apply the current 115 to the spin orbit torque metal layer during the third time period, causing the current flow 107 to flow along the spin orbit torque metal layer. The current 115 applied during the first time period may be substantially equal to the current 115 applied during the third time period.

The method 600 includes, at 608, discontinuing application of the current to the spin orbit torque metal layer during a fourth time period following the third time period. For example, the current source 120 may discontinue application of the current 115 during the fourth time period in the absence of application of a bias magnetic field as described above with reference to FIGS. 1-3. The magnetization of the free layer may settle in a second perpendicular orientation as described above with reference to FIG. 3. The second perpendicular orientation may correspond to a second state and may be associated with a second logical value. Thus, application and discontinuation of the current 115 during the third time period and the fourth time period, respectively, results in a second state of the perpendicular MTJ corresponding to a second logical value. Thus, the perpendicular MTJ may store the second logical value during the fourth time period (e.g., upon, in response to, or subsequent to, discontinuation of application of the current 115 in the absence of application of the bias magnetic field during the second time period). The state of the perpendicular MTJ during the fourth time period may be sensed by a sense amplifier (e.g., the sense amplifier may sense the stored first logical value of the perpendicular MTJ), and a random number generator may generate a random number based on the stored second logical value. For example, the random number generator may generate a first value for the bit 132 of FIG. 1 based on the perpendicular MTJ storing the second logical value upon, responsive to, or subsequent to, application and discontinuation of the current 115 in the absence of the bias magnetic field.

Thus, the perpendicular MTJ may, with substantially equal probability, store the first logical value or the second logical value upon, responsive to, or subsequent to, application and discontinuation of the current in the absence of application of the bias magnetic field. A random number generator may generate a random number based on the logical value stored by the perpendicular MTJ upon, responsive to, or subsequent to, application and discontinuation of the current in the absence of application of the bias magnetic field.

In conjunction with the described aspects, an apparatus includes means for indicating a logical value based on an orientation of a magnetization of a layer of the means for indicating. The means for indicating a logical value may include or may correspond to the perpendicular MTJ 102 of FIGS. 1-3, the perpendicular MTJ 402 of FIG. 4, the perpendicular MTJ 404 of FIG. 4, the perpendicular MTJ 406 of FIG. 6, one or more other structures or circuits configured to indicate a logical value based on a perpendicular orientation of a magnetization of a free layer, or any combination thereof.

The apparatus further includes means for inducing a spin orbit torque responsive to flow of an in-plane current along the means for inducing, the means for inducing coupled to the means for indicating a logical value. The means for inducing may correspond to the spin orbit torque metal layer 103 of FIGS. 1-4 or the spin orbit torque metal layer 401 of FIG. 4.

The apparatus further includes means for generating a random number at least partially based on a state of the means for indicating. The means for generating the random number may correspond to the random number generator 122 of FIG. 1.

The apparatus further includes means for supplying current. The means for supplying current may correspond to the current source 120 of FIG. 1. The means for applying current is configured to apply a current to the means for inducing during a first time period. The current may correspond to the current 115 of FIG. 1. Application of the current to the means for inducing produces the current flow along the means for inducing during the first time period as described above with reference to FIG. 1. Application of the current during the first time period may cause a magnetization of a free layer of the means for indicating to change states (e.g., from a perpendicular orientation to an in-plan orientation). In some examples, the current may be applied during the first time period in the absence of application of a bias magnetic field. The means for supplying current is further configured to discontinue application of the current to the means for inducing during a second time period following the first time period. In some examples, the current may be discontinued in the absence of application of the bias magnetic field. As described above with reference to FIGS. 1-3, in the absence of a bias magnetic field, a magnetization of the free layer of the means for indicating may settle, during the second time period, with substantially equal probability in one of multiple orientations. For example, the magnetization of the free layer of the means for indicating may settle with substantially equal probability in the orientation illustrated in FIG. 2 or in the orientation illustrated in FIG. 3.

Figure 7:
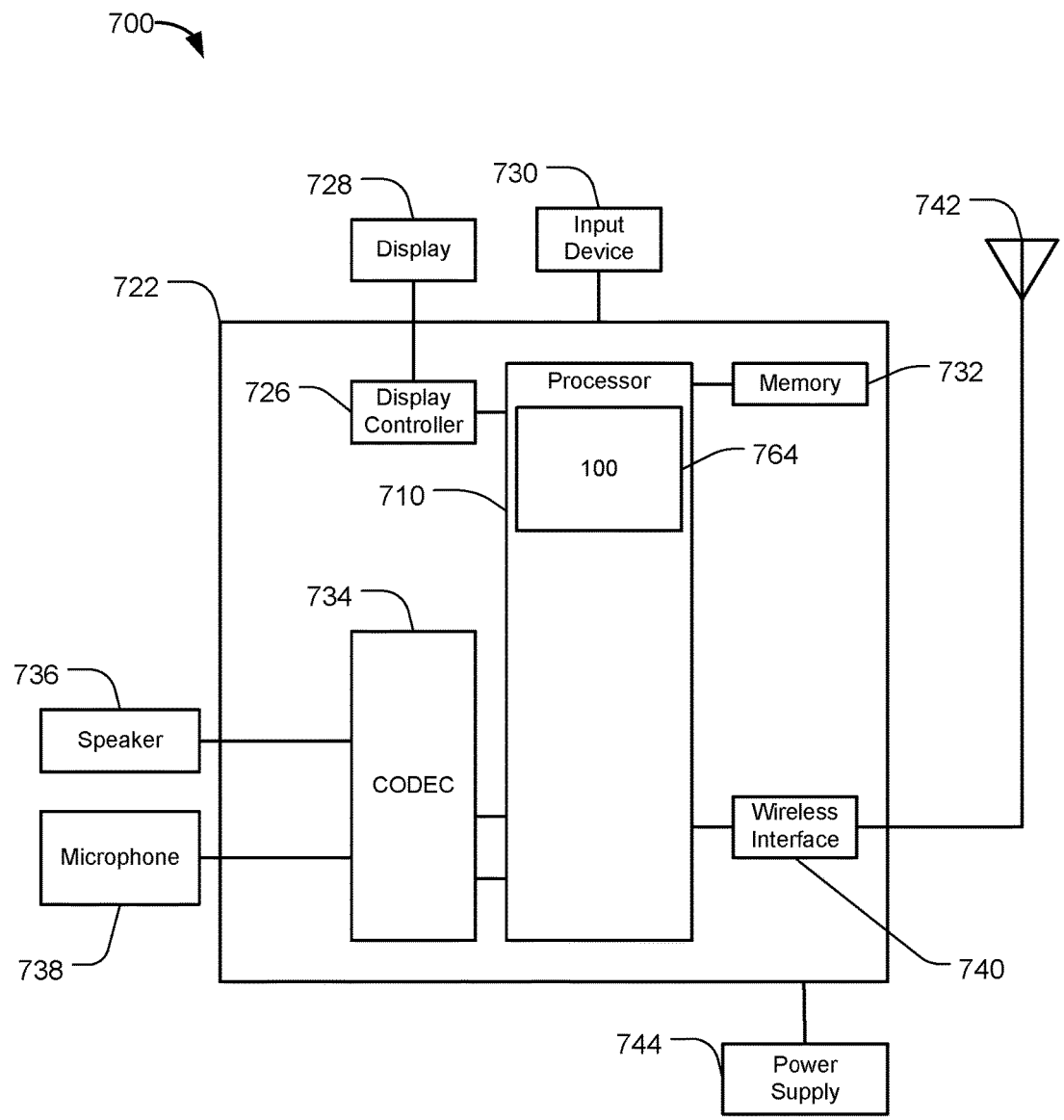
FIG. 7 is a block diagram of a wireless device that includes an a SOT-driven perpendicular MTJ random number generator.

Referring to FIG. 7, a block diagram of a particular illustrative implementation of a device (e.g., a wireless communication device) is depicted and generally designated 700. In various implementations, the device 700 may have more or fewer components than illustrated in FIG. 7.

In a particular implementation, the device 700 includes a processor 710, such as a central processing unit (CPU) or a digital signal processor (DSP), coupled to a memory 732. The processor 710 may include a spin orbit torque (SOT)-driven perpendicular MTJ device (that includes a spin orbit torque metal layer) and a random number generator configured to generate a random number based on a state of the SOT-driven perpendicular MTJ device, such as the apparatus 100 of FIGS. 1-3. The apparatus 100 may include a transistor array, such as the MTJ array 101 of FIGS. 1-3 or the MTJ array 400 of FIG. 4. The apparatus 100 may be configured to generate a random number sequence, such as the random number sequence 128 of FIGS. 1-3, to provide an encryption key associated with data communicated to another wireless device.

FIG. 7 also illustrates a display controller 726 that is coupled to the processor 710 and to a display 728. A coder/decoder (CODEC) 734 may also be coupled to the processor 710. Speaker(s) 736 and microphone(s) 738 may be coupled to the CODEC 734.

FIG. 7 also illustrates that a wireless interface 740, such as a wireless controller, may be coupled to the processor 710 and to an antenna 742, such that wireless data received via the antenna 742 and the wireless interface 740 may be provided to the processor 710. In some implementations, the processor 710, the display controller 726, the memory 732, the CODEC 734, and the wireless interface 740 are included in a system-in-package or system-on-chip device 722. In some implementations, an input device 730 and a power supply 744 are coupled to the system-on-chip device 722. Moreover, in a particular implementation, as illustrated in FIG. 7, the display 728, the input device 730, the speaker(s) 736, the microphone(s) 738, the antenna 742, and the power supply 744 are external to the system-on-chip device 722. In a particular implementation, each of the display 728, the input device 730, the speakers 736, the microphones 738, the antenna 742, and the power supply 744 may be coupled to a component of the system-on-chip device 722, such as an interface or a controller.

The device 700 may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 700 may include a set top box, an entertainment unit, a navigation device, a personal digital assistant (PDA), a monitor, a computer monitor, a television, a radio, a satellite radio, a music player, a digital music player, a portable music player, a video player, a digital video player, a digital video disc (DVD) player, a portable digital video player, a vehicle, a component integrated within a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a perpendicular magnetic tunnel junction (MTJ) including a free layer;
a spin orbit torque metal layer coupled to the perpendicular MTJ and configured to change a magnetization state of the free layer responsive to flow of an in-plane current along the spin orbit torque metal layer;
a current source configured to apply a current to the spin orbit torque metal layer causing the free layer to have a first magnetization orientation during a first time period and to discontinue application of the current to the spin orbit torque metal layer causing the free layer to have a second magnetization orientation during a second time period following the first time period; and
a random number generator configured to generate a random number at least partially based on a state of the perpendicular MTJ.

2. The apparatus of claim 1, wherein the spin orbit torque metal layer is substantially non-magnetic, and wherein the spin orbit torque metal layer is configured to exert a spin orbit torque on the free layer responsive to the flow of the current along spin orbit torque metal layer.

3. The apparatus of claim 1, wherein application of the current to the spin orbit torque metal layer produces the current flow along the spin orbit torque metal layer during the first time period.

4. The apparatus of claim 3, wherein the random number is based on whether the perpendicular MTJ has a parallel state or an anti-parallel state.

5. The apparatus of claim 3, wherein the current source is configured to apply the current during the first time period in the absence of application of a bias magnetic field to the perpendicular MTJ.

6. The apparatus of claim 4, wherein the current source is configured to discontinue application of the current during the second time period in the absence of application of a bias magnetic field.

7. The apparatus of claim 3, wherein the first magnetization orientation comprises a substantially in-plane magnetization orientation and the second magnetization orientation comprises a substantially perpendicular magnetization orientation.

8. The apparatus of claim 1, further comprising:
a bit line; and
a diode coupled between the perpendicular MTJ and the bit line.

9. The apparatus of claim 8, further comprising:
one or more additional perpendicular MTJs coupled to the spin orbit torque metal layer;
one or more additional bit lines; and
one or more additional diodes coupled between the one or more additional perpendicular MTJs and the one or more additional bit lines.

10. A method comprising:
changing a magnetization state of a free layer of a perpendicular magnetic tunnel junction (MTJ) responsive to flow of an in-plane current along a spin orbit torque metal layer that is coupled to the perpendicular MTJ, wherein changing the magnetization state of the free layer includes applying a current to the spin orbit torque metal layer causing the free layer to have a first magnetization orientation during a first time period and discontinuing application of the current to the spin orbit torque metal layer causing the free layer to have a second magnetization orientation during a second time period following the first time period; and
generating a random number based at least in part on a state of the perpendicular MTJ.

11. The method of claim 10, wherein application of the current to the spin orbit torque metal layer results in the current flow along the spin orbit torque metal layer.

12. The method of claim 11, wherein the first magnetization orientation comprises a substantially in-plane magnetization orientation and the second magnetization orientation comprises a substantially perpendicular magnetization orientation.

13. The method of claim 12, wherein application of the current to the spin orbit torque metal layer during the first time period results in a first state of the perpendicular MTJ corresponding to a first logical value, and further comprising:
applying the current to the spin orbit torque metal layer during a third time period following the second time period; and
discontinuing application of the current to the spin orbit torque metal layer during a fourth time period following the third time period,
wherein the current applied during the first time period is substantially equal to the current applied during the third time period, and
wherein the application and discontinuation of the current during the third time period and the fourth time period results in a second state of the perpendicular MTJ corresponding to a second logical value.

14. The method of claim 12, wherein application of the current to the spin orbit torque metal layer is discontinued, during the second time period, in the absence of application of a bias magnetic field to the perpendicular MTJ.

15. The method of claim 11, wherein applying, during the first time period, the current to the spin orbit torque metal layer changes a magnetization of a second free layer of a second perpendicular MTJ coupled to the spin orbit torque metal layer responsive to the current flow along the spin orbit torque metal layer.

16. An apparatus comprising:
a first perpendicular magnetic tunnel junction (MTJ) including a first free layer;
a second perpendicular MTJ including a second free layer;
a word line;
a spin orbit torque metal layer coupled to the first free layer, to the second free layer, and to the word line, the spin orbit torque metal layer configured to change a magnetization state of the first free layer and the second free layer responsive to flow of a current along the spin orbit torque metal layer; and a current source configured to apply a current to the spin orbit torque metal layer during a first time period and to discontinue application of the current to the spin orbit torque metal layer during a second time period following the first time period, wherein at least one of the first and second perpendicular MTJ is configured to have a first magnetization orientation during the first time period and a second magnetization orientation during the second time period.

17. The apparatus of claim 16, further comprising:
a first bit line; and
a first diode coupled between the first perpendicular MTJ and the first bit line.

18. The apparatus of claim 17, further comprising:
a second bit line; and
a second diode coupled between the second perpendicular MTJ and the second bit line.

19. The apparatus of claim 18, further comprising:
a third perpendicular MTJ including a third free layer;
a second word line; and
a second spin orbit torque metal layer coupled to the third perpendicular MTJ and to the second word line, the second spin orbit torque metal layer configured to change a magnetization state of the third free layer responsive to flow of a current along the second spin orbit torque metal layer.

20. The apparatus of claim 19, further comprising a third diode coupled between the third perpendicular MTJ and the first bit line.

21. An apparatus comprising:
means for indicating a logical value based on an orientation of a magnetization of a layer of the means for indicating;
means for inducing a spin orbit torque responsive to flow of an in-plane current along the means for inducing, the means for inducing coupled to the means for indicating a logical value;
means for supplying current to:
apply a current to the means for inducing causing the layer to have a first magnetization orientation during a first time period; and
discontinue application of the current to the means for inducing causing the layer to have a second magnetization orientation during a second time period following the first time period; and
means for generating a random number at least partially based on a state of the means for indicating.

22. The apparatus of claim 21, wherein application of the current to the means for inducing produces the current flow along the means for inducing during the first time period.

23. The apparatus of claim 22, wherein the means for supplying is configured to apply the current during the first time period in the absence of application of a bias magnetic field to the means for indicating.

24. The apparatus of claim 23, wherein the means for supplying is configured to discontinue application of the current during the second time period in the absence of application of the bias magnetic field.

* * * * *